US012787186B2

(12) United States Patent
Jiang et al.

(10) Patent No.: US 12,787,186 B2

(45) Date of Patent: Nov. 3, 2026

(54) WIRELESS SWITCH PANEL INTEGRATED WITH MAGNETIC ELECTRIC-SHOCK CHARGING FIXED BASE

(71) Applicant: Guangzhou Jinmaike Technology Co., Ltd, Guangzhou (CN)

(72) Inventors: Maoan Jiang, Shangrao (CN); Laihua Feng, Guangzhou (CN)

( * ) Notice: Subject to any disclaimer, the term of this patent is extended or adjusted under 35 U.S.C. 154(b) by 141 days.

(21) Appl. No.: 18/922,450

(22) Filed: Oct. 22, 2024

(65) Prior Publication Data

US 2026/0113855 A1 Apr. 23, 2026

(51) Int. Cl.

| | |
|---|---|
| ***H05K 7/14*** | (2006.01) |
| ***H01R 13/62*** | (2006.01) |
| ***H02J 7/70*** | (2026.01) |
| ***H05K 5/02*** | (2006.01) |

(52) U.S. Cl.

CPC ....... *H05K 5/0217* (2013.01); *H01R 13/6205* (2013.01); *H02J 7/731* (2026.01); *H05K 7/1427* (2013.01)

(58) Field of Classification Search

USPC ................................ 361/752, 807, 809, 810

See application file for complete search history.

(56) References Cited

U.S. PATENT DOCUMENTS 4,097,012 A * 6/1978 McIntyre ............ B60R 11/0205 224/570

5,109,411 A * 4/1992 O'Connell ......... F16M 11/2021 379/454

FOREIGN PATENT DOCUMENTS

CN 217087530 U 7/2022

WO WO-2024158350 A1 * 8/2024 .............. H02J 7/731

* cited by examiner

*Primary Examiner* — Hung S. Bui

(74) *Attorney, Agent, or Firm* — Pasadena Legal Group; Norman R. Van Treeck

(57) ABSTRACT

A wireless switch panel integrated with a magnetic electric-shock charging fixed base is provided. The wireless switch panel integrated with the magnetic electric-shock charging fixed base includes: a magnetic charging stand, a wireless panel, and an angle adjustment bracket. The magnetic charging stand includes: an outer protective casing and a rear mounting plate. The outer protective casing is fixedly connected to a front side edge of the rear mounting plate. Interior of the outer protective casing is concave. The angle adjustment bracket is provided on a rear side of the rear mounting plate. A magnetic connection male socket is fixedly connected to the middle of an inner-side bottom end of the outer protective casing. The angle adjustment bracket includes: a support plate and a support base. A rotating shaft runs through two upper ends of the support base. Two charging manners are provided on the wireless panel.

7 Claims, 8 Drawing Sheets

WIRELESS SWITCH PANEL INTEGRATED WITH MAGNETIC ELECTRIC-SHOCK CHARGING FIXED BASE

TECHNICAL FIELD

The present disclosure relates to the technical field of home wireless switch panels, and in particular to a wireless switch panel integrated with a magnetic electric-shock charging fixed base.

BACKGROUND

A wireless mutually controlled switch is a new lighting switch that has a function of a traditional mechanical lighting switch, has a built-in wireless radio frequency transmitting and receiving module, and may be wirelessly mutually controlled after corresponding models are selected to directly replace ordinary wall switches and coded.

Existing switch panels on the market are generally connected to control boxes with wires, which may be troubled by wiring in use. An ordinary wireless switch panel adopts a power supply manner of supplying power by using a single usb charging cable. A bracket fixing the panel is non-detachably and fixedly mounted, which cannot be easily removed for use once mounted. As a result, it is extremely inconvenient to control electrical appliances next to a sofa or bed.

When applying for the present disclosure, the applicant, after searching, finds that a Chinese patent discloses “PANEL WITH MAGNETIC WIRELESS CHARGING FUNCTION” with application Number “202123077266.0”. In the Pat., the panel can be directly mounted on a wall in same mounting manner as the ordinary 86-type panel, which does not occupy any desktop area and has no exposed connection cables, making it easy and fast to use. The panel is especially suitable for mounting on a wall at a position similar to a height of a desktop such as an office desk, a desk, or a bedside table. By magnetic fixation, placement of an electronic device during charging may not to be restricted by traditional mechanical fixation manners, allowing for freer placement and wider applicability. At the same time, in addition to the wireless charging function, the panel is further provided with at least two universal USB interfaces at the bottom, which may also provide a wired charging/power supply function. When the entire panel is assembled with other standard switch panels, the panel and the wall form a certain angle. The angle is similar to that of a rocker switch. Appearance consistency is good when they are assembled. However, the magnetic function of the patent is the same as the traditional switch structure. In today’s era of rapid development, convenience of use of smart control panels are required to be improved. Therefore, according to the applicant’s invention, a wireless switch panel that can be used for a magnetic electric-shock charging fixed base is invented, which solves the problem that traditional fixed mounting cannot facilitate manual taking and easy use.

SUMMARY

(I) Technical Problem Solved

In view of the shortcomings of the prior art, the present disclosure provides a wireless switch panel integrated with a magnetic electric-shock charging fixed base, which solves the problem of extreme inconvenience to control electrical appliances next to a sofa or bed due to the fact that the existing control boxes connected with wires may be troubled by wiring in use, an ordinary wireless switch panel adopts a power supply manner of supplying power by using a single usb charging cable, and a bracket fixing the panel is non-detachably and fixedly mounted and cannot be easily removed for use once mounted.

(II) Technical Solution

In order to achieve the above objective, the present disclosure is implemented through the following technical solution: a wireless switch panel integrated with a magnetic electric-shock charging fixed base, including: a magnetic charging stand, a wireless panel, and an angle adjustment bracket, wherein the magnetic charging stand includes: an outer protective casing and a rear mounting plate, the outer protective casing is fixedly connected to a front side edge of the rear mounting plate, interior of the outer protective casing is concave, the angle adjustment bracket is provided on a rear side of the rear mounting plate, a magnetic connection male socket is fixedly connected to the middle of an inner-side bottom end of the outer protective casing, the angle adjustment bracket includes: a support plate and a support base, a rotating shaft runs through two upper ends of the support base, the support plate sleeves the middle of the rotating shaft, the support plate is fixedly connected to the rear mounting plate, the wireless panel is sheathed inside the outer protective casing, the wireless panel includes a control panel, a panel support plate, a panel printed circuit board (PCB), and a panel bottom cover, a storage battery is fixedly connected to the middle of an inner side of the panel bottom cover, an inner side of the storage battery is provided with the panel PCB, the panel PCB and the panel bottom cover are bolted, the panel support plate is fixedly connected to an inner side of the panel PCB, a surface of the panel support plate is provided with the control panel, a magnetic connection female socket is provided in the middle of a bottom end of the wireless panel, and the magnetic connection male socket and the magnetic connection female socket are in plug fit.

Preferably, one side of the wireless panel is provided with a type-C port, the type-C port being internally filled with a dust-proof rubber plug. The dust-proof rubber plug blocks the type-C port to increase a sealing effect and prevent an influence on a use effect due to splashing of moisture and penetration of dust.

Preferably, a switch is provided in the middle of one side of the wireless panel. On and Off of the wireless panel are controlled through the switch.

Preferably, a plurality of panel keys are fixedly connected to interior of the panel PCB. The use of the wireless panel is controlled through the keys on the panel.

Preferably, a surface of the wireless panel is covered with a panel top cover, the panel top cover having an arc-shaped corner and in plug fit with an inner wall of the outer protective casing. The arrangement of the arc-shaped panel top cover increases hand-holding comfort, which is in plug fit with the outer protective casing to form a drawer-type combination.

Preferably, the rotating shaft includes a bolt and nut structure. Through the bolt and nut structure, it is convenient to adjust angle rotation. When bolts and nuts are loosened, angle adjustment and control can be performed, and after tightening, angle limitations may be increased.

Preferably, the magnetic charging stand has a drawer-type structure. The drawer-type structure facilitates removal and insertion of the wireless panel.

(III) Beneficial Effect

The present disclosure provides a wireless switch panel integrated with a magnetic electric-shock charging fixed base. The following beneficial effects are achieved.

1. In the present disclosure, a wireless panel, a magnetic connection female socket, and a magnetic connection male socket are provided, the wireless panel is further provided with the magnetic connection female socket at the bottom, the magnetic connection male socket is integrated on the magnetic charging stand, and when the wireless panel is placed back on the magnetic charging stand, the magnetic connection male socket and the magnetic connection female socket may be automatically magnetically attracted to a charging interface for charging, improving the convenience of use and the use effect.
2. Two charging manners are provided on the wireless panel in the present disclosure. In one manner, power is supplied by a conventional type-C port charging cable. In the other manner, magnetic electric-shock charging is integrated on a quick-release sliding base. The wireless panel can be automatically adsorbed and connected for charging when placed on the base. At the same time, the problem of wiring caused by wired connection control is solved.
3. The present disclosure solves the problem of non-detachable mounting methods of conventional fixed brackets, adopts a drawer-type base bracket, and realizes a pick-and-place fixing manner by pulling.

Figure 1:
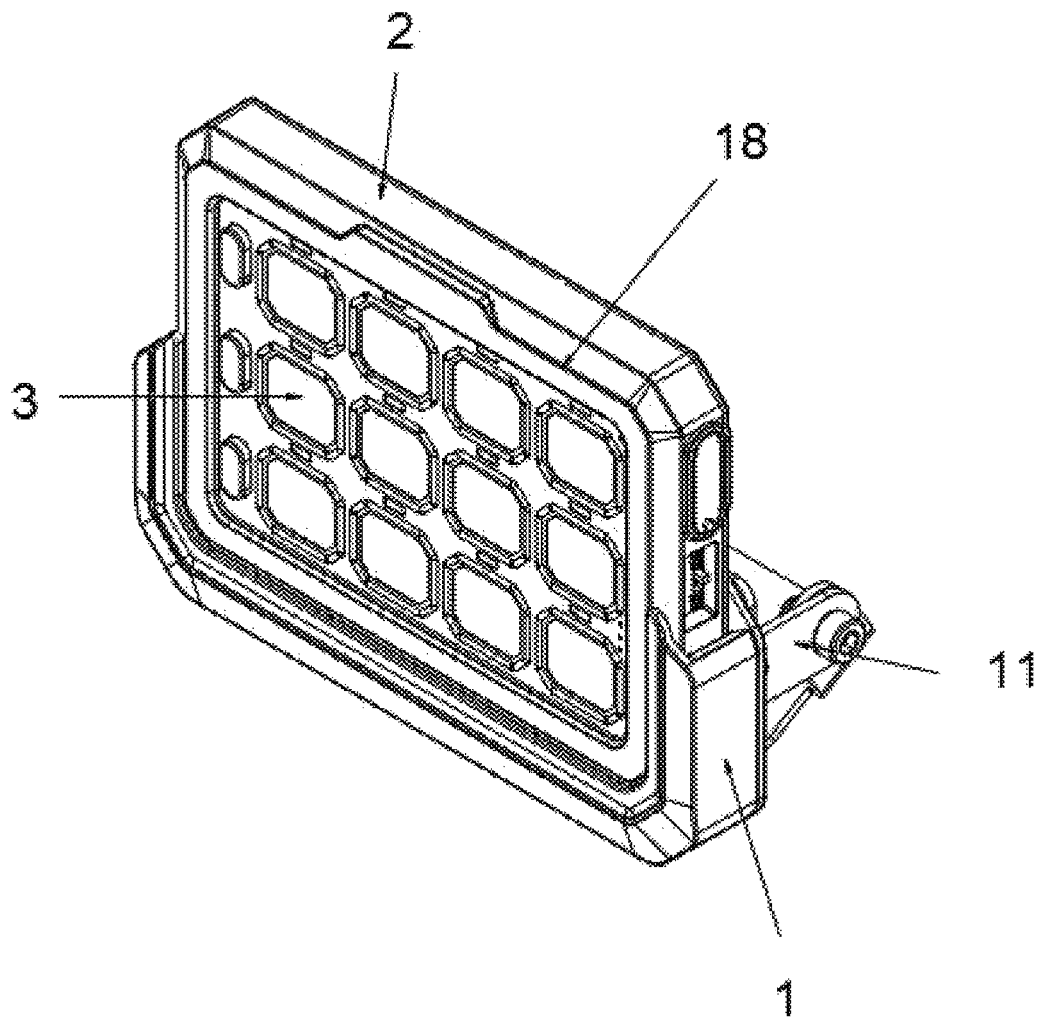
FIG. 1 is a schematic diagram of a three-dimensional structure according to the present disclosure.
Figure 2:
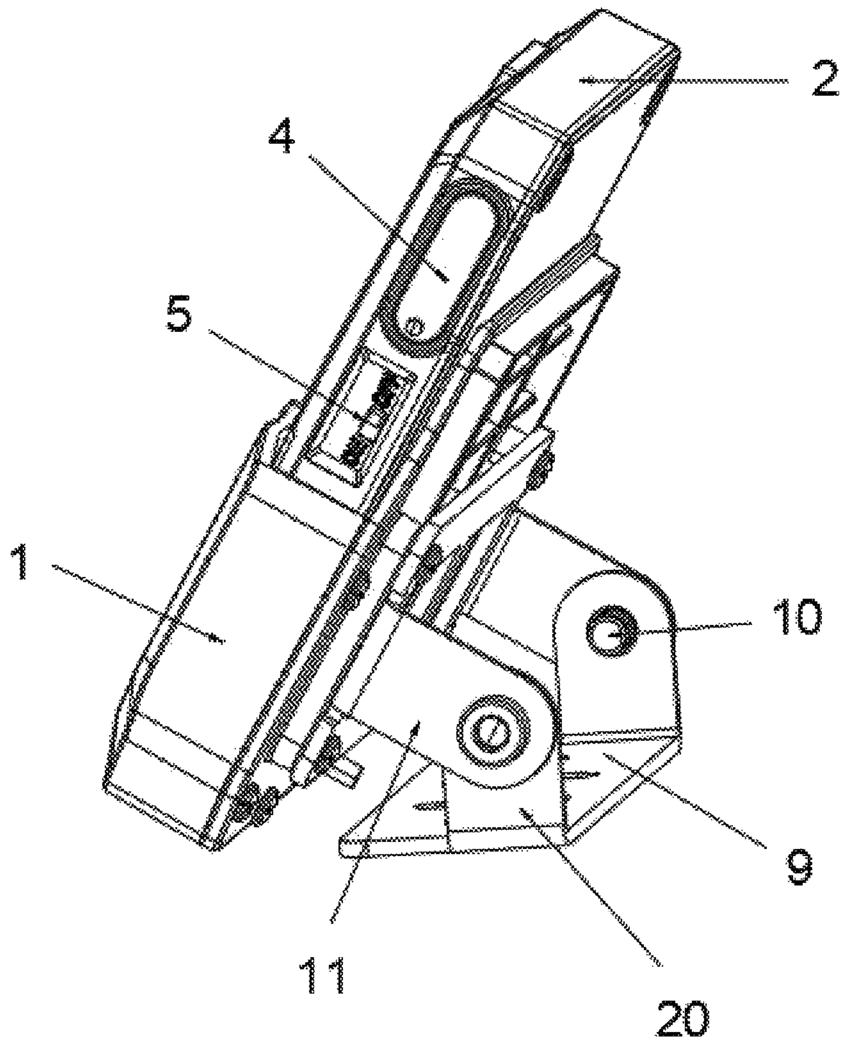
FIG. 2 is a schematic diagram of three-dimensional display of a rear side according to the present disclosure.
Figure 3:
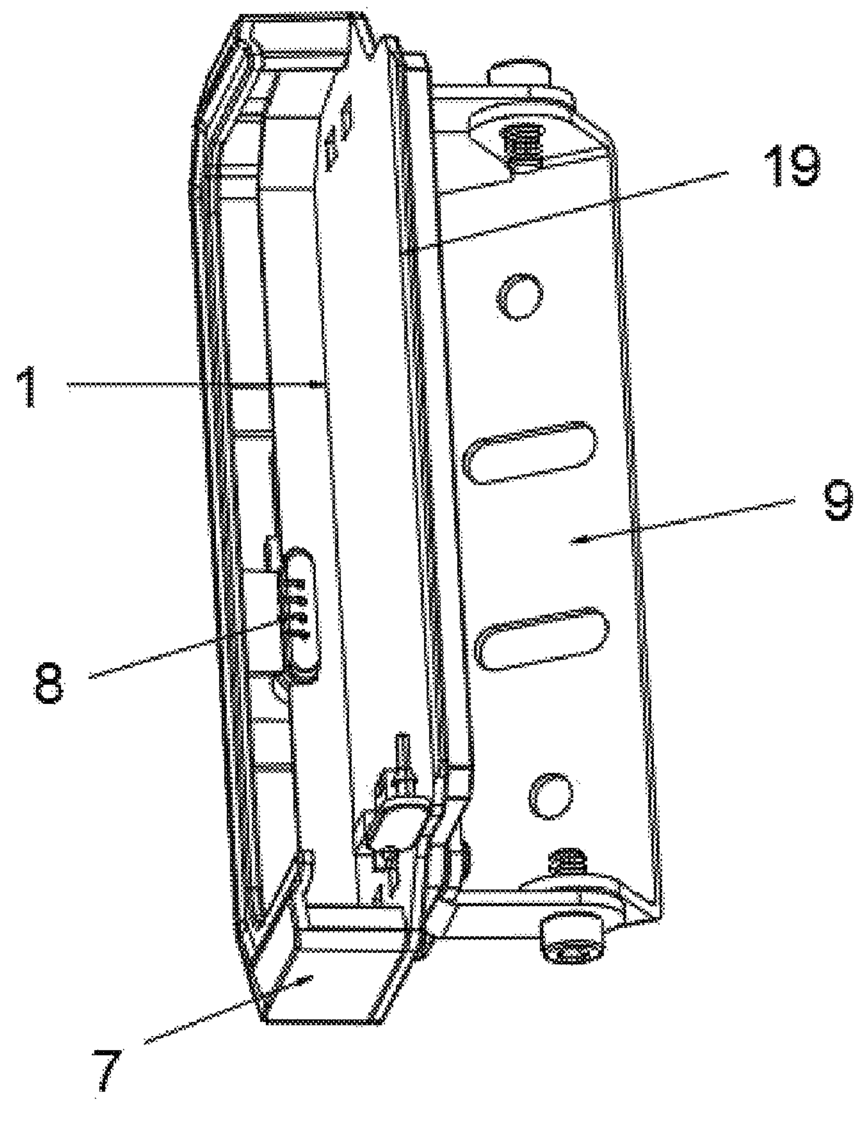
FIG. 3 is a schematic top view of a magnetic charging stand according to the present disclosure.
Figure 4:
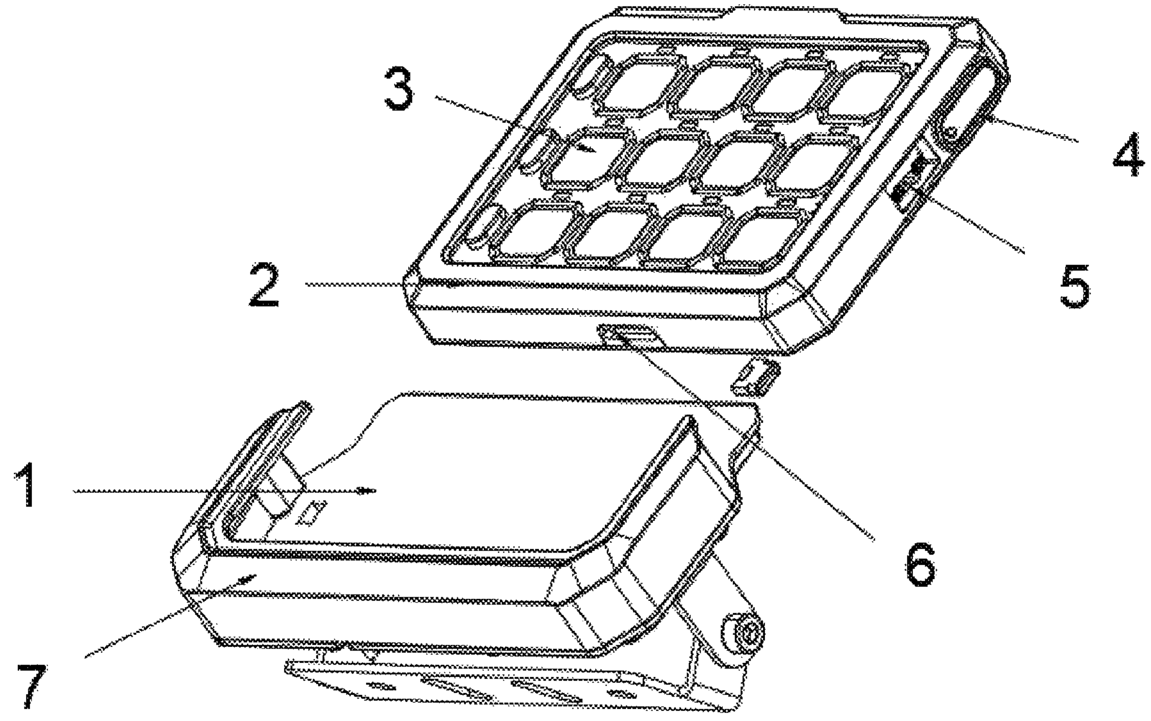
FIG. 4 is a schematic diagram of splitting of a wireless panel and a magnetic charging stand according to the present disclosure.
Figure 5:
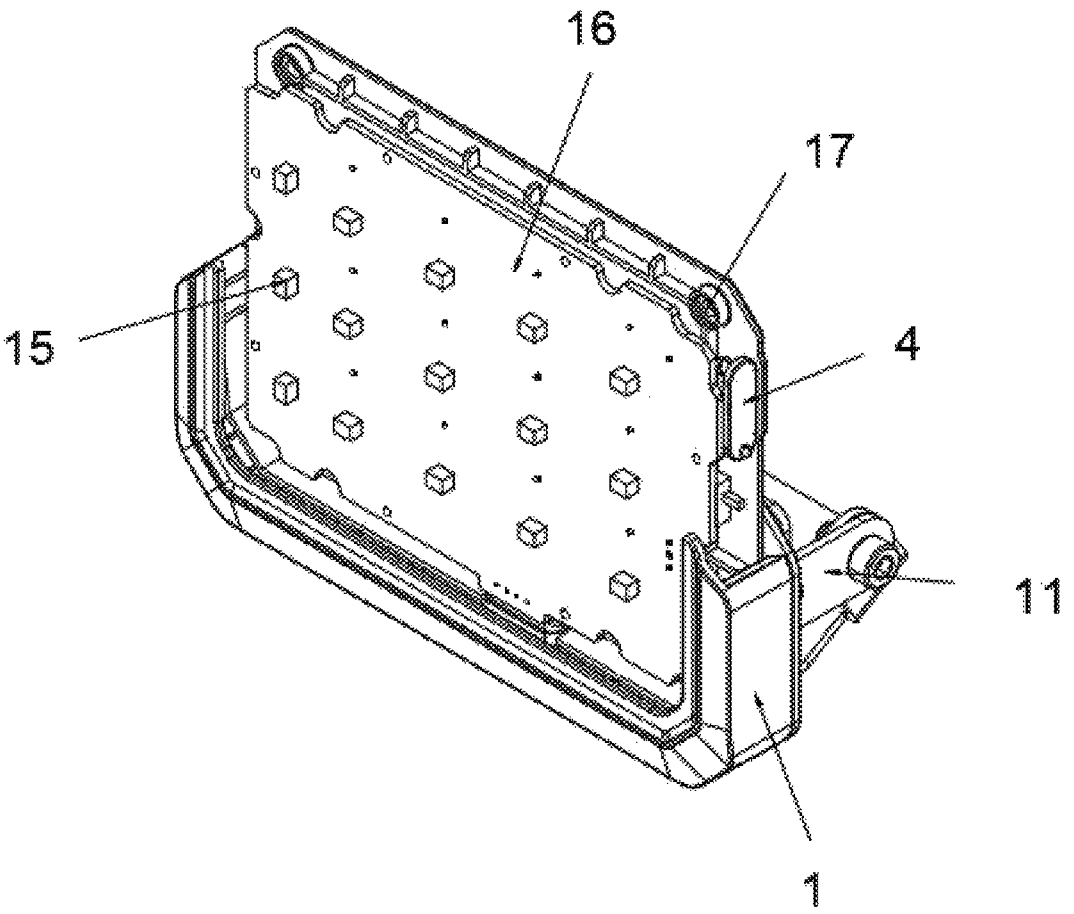
FIG. 5 is a schematic diagram of a panel PCB according to the present disclosure.
Figure 6:
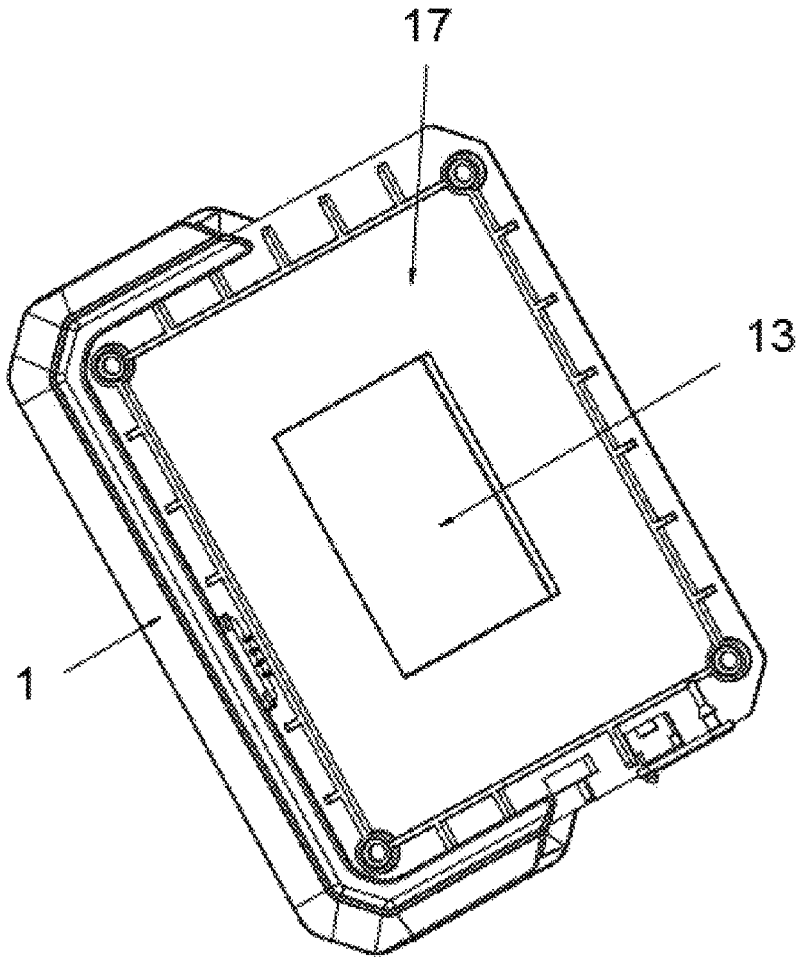
FIG. 6 is a schematic diagram of a panel bottom cover according to the present disclosure.
Figure 7:
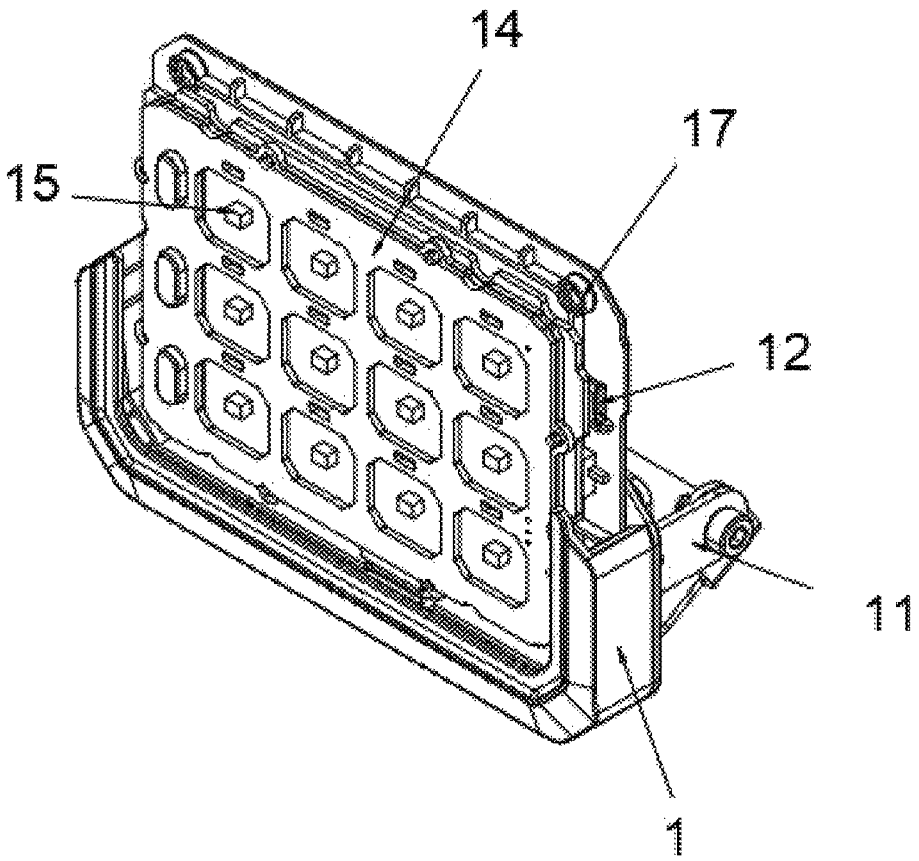
FIG. 7 is a schematic diagram of a panel support plate according to the present disclosure.

1: magnetic charging stand; 2: wireless panel; 3: control panel; 4: dust-proof rubber plug; 5: switch; 6: magnetic connection female socket; 7: outer protective casing; 8: magnetic connection male socket; 9: support base; 10: rotating shaft; 11: support plate; 12: type-C port; 13: storage battery; 14: panel support plate; 15: panel key; 16: panel PCB; 17: panel bottom cover; 18: panel top cover; 19: rear mounting plate; 20: angle adjustment bracket.

DETAILED DESCRIPTION OF THE EMBODIMENTS

The technical solutions in the embodiments of the present disclosure will be clearly and completely described below with reference to the accompanying drawings in the embodiments of the present disclosure. Obviously, the described embodiments are only some of rather than all of the embodiments of the present disclosure. Based on the embodiments in the present disclosure, all other embodiments obtained by those of ordinary skill in the art without creative efforts fall within the scope of protection of the present disclosure.

EMBODIMENT

As shown in FIG. 1 to FIG. 8, an embodiment of the present disclosure provides a wireless switch panel integrated with a magnetic electric-shock charging fixed base, including: a magnetic charging stand 1, a wireless panel 2, and an angle adjustment bracket 20. The magnetic charging stand 1 includes: an outer protective casing 7 and a rear mounting plate 19. The outer protective casing 7 is fixedly connected to a front side edge of the rear mounting plate 19. A supporting function is improved through the outer protective casing 7, which can facilitate insertion of the wireless panel 2. Interior of the outer protective casing 7 is concave. The wireless panel 2 is inserted through the concave structure, which is not easy to drop and is easy to use and store. The angle adjustment bracket 20 is provided on a rear side of the rear mounting plate 19. The angle adjustment bracket 20 can freely adjust and control a support angle of the magnetic charging stand 1, improving convenience of taking. A magnetic connection male socket 8 is fixedly connected to the middle of an inner-side bottom end of the outer protective casing 7. The angle adjustment bracket 20 includes: a support plate 11 and a support base 9. A rotating shaft 10 runs through two upper ends of the support base 9. The rotating shaft 10 includes a bolt and nut structure. Through the bolt and nut structure, it is convenient to adjust angle rotation, when bolts and nuts are loosened, angle adjustment and control can be performed, and after tightening, angle limitations may be increased. The support plate 11 sleeves the middle of the rotating shaft 10. Through rotation fit between the support plate 11 and the support base 9, the adjustment of angle rotation is completed. Moreover, the support plate 11 is fixedly connected to the rear mounting plate 19. The wireless panel 2 is sheathed inside the outer protective casing 7. The wireless panel 2 includes a control panel 3, a panel support plate 14, a panel PCB 16, and a panel bottom cover 17. A storage battery 13 is fixedly connected to the middle of an inner side of the panel bottom cover 17. The wireless panel 2 is provided with power storage through the storage battery 13. An inner side of the storage battery 13 is provided with the panel PCB 16. A circuit is controlled by the panel PCB 16. The panel PCB 16 and the panel bottom cover 17 are bolted. The panel support plate 14 is fixedly connected to an inner side of the panel PCB 16. The panel support plate 14 provides structural support to facilitate position fixation of the control panel 3 and the panel PCB 16 on the rear side. A surface of the panel support plate 14 is provided with the control panel 3. A magnetic connection female socket 6 is provided in the middle of a bottom end of the wireless panel 2, and the magnetic connection male socket 8 and the magnetic connection female socket 6 are in plug fit. The wireless panel 2 is further provided with the magnetic connection female socket 6 at the bottom, the magnetic connection male socket 8 is integrated on the magnetic charging stand 1, and when the wireless panel 2 is placed back on the magnetic charging stand 1, the magnetic connection male socket 8 and the magnetic connection female socket 6 may be automatically magnetically attracted to a charging interface for charging.

One side of the wireless panel 2 is provided with a type-C port 12. There is a type-C port 12 in an upper right corner of the wireless panel 2. Charging may be performed through a conventional type-C port 12 charger on the market. The type-C port 12 is internally filled with a dust-proof rubber plug 4. A dust-proof sealing effect is improved through the dust-proof rubber plug 4. A switch 5 is provided in the middle of one side of the wireless panel 2. Use of the wireless panel 2 can be controlled through the switch 5. A plurality of panel keys 15 are fixedly connected to interior of the panel PCB 16. The panel PCB 16 is controlled through the panel keys 15. A surface of the wireless panel 2 is covered with a panel top cover 18. The panel top cover 18 has an arc-shaped corner and is in plug fit with an inner wall of the outer protective casing 7. The magnetic charging stand 1 has a drawer-type structure. The wireless panel 2 can be flexibly taken and placed through the matching drawer-type movable base. Automatic connection and charging can be realized when the wireless panel 2 is placed.

Figure 8:
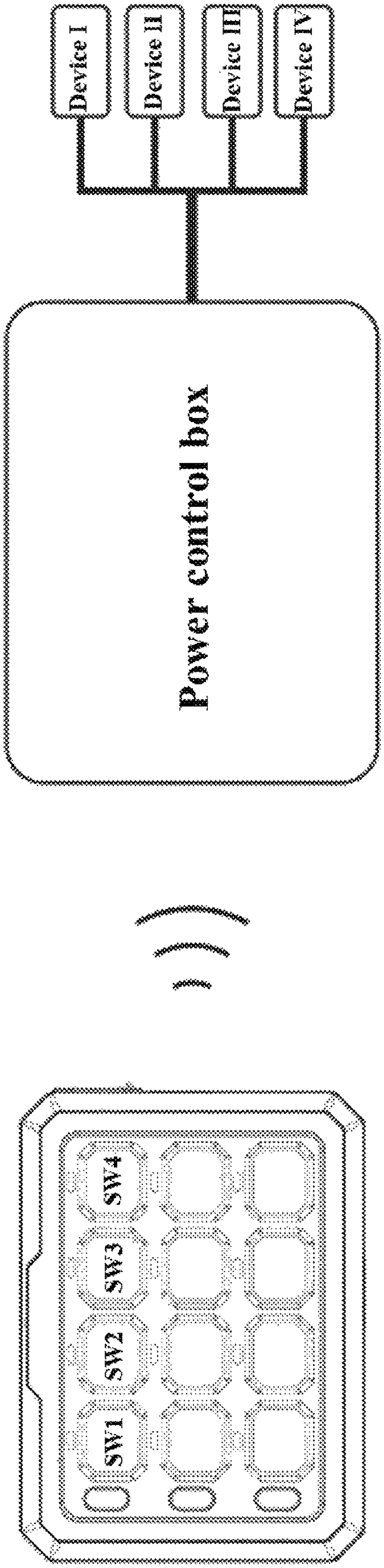
FIG. 8 is a schematic flowchart of wireless control according to the present disclosure.

Operating principle: In use, the switch 5 is turned on, and a radio frequency wireless transceiver on the wireless panel 2 sends a signal to a power control box end. As shown in FIG. 8, the power control box receives the signal to control On and Off of an electronic device. There is a type-C port 12 in an upper right corner of the wireless panel 2. Charging may be performed through a conventional type-C port 12 charger on the market. The wireless panel 2 is further provided with the magnetic connection female socket 6 at the bottom, the magnetic connection male socket 8 is integrated on the magnetic charging stand 1, and when the wireless panel 2 is placed back on the magnetic charging stand 1, the magnetic connection male socket 8 and the magnetic connection female socket 6 may be automatically magnetically attracted to a charging interface for charging. The angle adjustment bracket 20 can freely adjust and control a support angle of the magnetic charging stand 1, improving convenience of taking.

Although the embodiments of the present disclosure have been illustrated and described, it may be understood by those of ordinary skill in the art that various changes, modifications, substitutions, and variations can be made to these embodiments without departing from the principles and spirit of the present disclosure. The scope of the present disclosure is defined by the appended claims and equivalents thereof.

What is claimed is:

1. A wireless switch panel integrated with a magnetic electric-shock charging fixed base, comprising: a magnetic charging stand, a wireless panel, and an angle adjustment bracket, wherein the magnetic charging stand comprises: an outer protective casing and a rear mounting plate, the outer protective casing is fixedly connected to a front side edge of the rear mounting plate, an interior of the outer protective casing is concave, the angle adjustment bracket is provided on a rear side of the rear mounting plate, a magnetic connection male socket is fixedly connected to a middle of an inner-side bottom end of the outer protective casing, the angle adjustment bracket comprises a support plate and a support base, a rotating shaft runs through two upper ends of the support base, the support plate sleeves a middle of the rotating shaft, the support plate is fixedly connected to the rear mounting plate, the wireless panel is sheathed inside the outer protective casing, the wireless panel comprises a control panel, a panel support plate, a panel printed circuit board (PCB), and a panel bottom cover, a storage battery is fixedly connected to a middle of an inner side of the panel bottom cover, an inner side of the storage battery is provided with the panel PCB, the panel PCB and the panel bottom cover are bolted, the panel support plate is fixedly connected to an inner side of the panel PCB, a surface of the panel support plate is provided with the control panel, a magnetic connection female socket is provided in a middle of a bottom end of the wireless panel, and the magnetic connection male socket and the magnetic connection female socket are in plug fit.

2. The wireless switch panel integrated with the magnetic electric-shock charging fixed base according to claim 1, wherein a side of the wireless panel is provided with a type-C port, wherein the type-C port is internally filled with a dust-proof rubber plug.

3. The wireless switch panel integrated with the magnetic electric-shock charging fixed base according to claim 1, wherein a switch is provided in a middle of a side of the wireless panel.

4. The wireless switch panel integrated with the magnetic electric-shock charging fixed base according to claim 1, wherein a plurality of panel keys are fixedly connected to an interior of the panel PCB.

5. The wireless switch panel integrated with the magnetic electric-shock charging fixed base according to claim 1, wherein a surface of the wireless panel is covered with a panel top cover, wherein the panel top cover has an arc-shaped corner and is in plug fit with an inner wall of the outer protective casing.

6. The wireless switch panel integrated with the magnetic electric-shock charging fixed base according to claim 1, wherein the rotating shaft comprises a bolt and nut structure.

7. The wireless switch panel integrated with the magnetic electric-shock charging fixed base according to claim 1, wherein the magnetic charging stand has a drawer-type structure.

* * * * *